United States Patent
Saran et al.

[19]

[11] Patent Number: 6,143,396
[45] Date of Patent: Nov. 7, 2000

[54] SYSTEM AND METHOD FOR REINFORCING A BOND PAD

[75] Inventors: Mukul Saran, Richardson; Charles A. Martin, McKinney, both of Tex.

[73] Assignee: Texas Instruments Incorporated, Dallas, Tex.

[21] Appl. No.: 08/847,239

[22] Filed: Apr. 30, 1997

[51] Int. Cl.[7] .................................................. H01L 23/52

[52] U.S. Cl. ......................... 428/162; 428/164; 428/209; 257/773

[58] Field of Search ..................................... 428/621, 620, 428/622, 623, 626, 627, 632, 633, 614, 469, 164, 472, 162, 209, 210, 312.8, 201; 257/773, 775, 784

[56] References Cited

U.S. PATENT DOCUMENTS

| | | | |
|---|---|---|---|
| 4,572,754 | 2/1986 | Bloom | 156/89 |
| 5,068,714 | 11/1991 | Seipler | 357/80 |
| 5,085,922 | 2/1992 | Murasawa | 428/209 |
| 5,288,661 | 2/1994 | Satoh et al. | 437/195 |
| 5,309,025 | 5/1994 | Bryant et al. | 257/784 |
| 5,391,516 | 2/1995 | Wojnarowski et al. | 437/174 |
| 5,686,762 | 11/1997 | Langley | 257/775 |
| 5,700,735 | 12/1997 | Shiue et al. | 438/612 |
| 5,703,408 | 12/1997 | Ming-Tsung et al. | 257/784 |

FOREIGN PATENT DOCUMENTS

| | | |
|---|---|---|
| 0 244 699 A2 | 11/1987 | European Pat. Off. . |
| 0 340 727 A2 | 11/1989 | European Pat. Off. . |
| 01065895 | 3/1989 | Japan . |
| 02026039 | 1/1990 | Japan . |

OTHER PUBLICATIONS

Saran, Mukul, et al. "Elimination of Bond–pad Damage Through Structural Reinforcement of Intermetal Dielectrics," 1998 IEEE International Reliability Physics Symposium Proceedings, 36th Annual, Reno, NV, XP002112247, pp. 225–231.

Alan A. Facer, "New Test Controls Gold Wire Bonding," Semiconductor International, Nov. 1992.

Denis Boulanger, "Wirebonding to Soft Substrates," Microwave Journal, Feb. 1990.

"Mechanical Problems in Wire Bonding," 1988 VLSI and GaAs Packaging Workshop, Santa Clara, California, Sep. 12–14, 1988.

Winchell, et al., "Enhancing Ultrasonic Bond Development," IEEE Transactions on Components, Hybrids and Manufacturing Technology, vol. CHMT–1, No. 3, Sep. 1978.

Jerry Carlson, "Advances in the Reliability of Ultrasonic Wire Bonding," Semmiconductor International UK, Birmingham, England, Sep. 25, 1984.

Weib, et al., "A Reliable Thermosonic Wire Bond of GaAs–Devices Analysed by Infrared–Microscopy," 1994 IEEE, (No month).

Ideka, et al., "Damage Analysis of Semiconductor Chip during Wire Bonding Process," Japan Mechanical Engineering Journal, No. 95–1149, vol. 62, No. 595, Mar., 1996.

Ching, et al., "Bond Pad Structure Reliability," 1988 Proceedings IEEE/IRPS, (No month).

*Primary Examiner*—John J. Zimmerman
*Attorney, Agent, or Firm*—W. Daniel Swayze, Jr.; W. James Brady, III; Frederick J. Telecky, Jr.

[57] ABSTRACT

The reinforcing system (10, 70, 90) for a bond pad (12, 72, 92) includes at least one dielectric layer or stack (20, 21, 22, 76, 78, 96, 98) disposed under the bond pad (12, 72, 92). A reinforcing patterned structure (30, 80, 82, 100, 102) is disposed in the dielectric layer or stack (20, 21, 22, 76, 78, 96, 98).

16 Claims, 3 Drawing Sheets

SYSTEM AND METHOD FOR REINFORCING A BOND PAD

TECHNICAL FIELD OF THE INVENTION

This invention is related in general to the field of semiconductor devices and processes. More particularly, the invention is related to system and method for reinforcing a bond pad.

BACKGROUND OF THE INVENTION

A well known problem area in semiconductor processing is the process of attaching a solder, wire or other bonding elements to a bond pad on a semiconductor integrated circuit. These bond pads are typically disposed above one or more layers or stacks of brittle and/or soft dielectric materials, typically oxide of silicon and some organic materials, for planarization and insulation purposes. Some dielectric materials, such as hydrogen silsesquioxane (HSQ), aerogels, organic polyimides, and parylenes are advantageous for their low dielectric constants compared to silicon oxides, but are weaker structurally and mechanically.

During the bonding process, mechanical loading and ultrasonic stresses applied by the bonding capillary tip to the bond pad often result in fracture of the underlying dielectrics, deformation of the underlying metal structures, and delamination of the layers in the metal structures. These bonding failures may appear as craters in the bond pad and underlying layers as the bonding capillary tip is pulled away from the bonding pad. However, these defects often are not apparent during bonding but would manifest themselves during subsequent bond pull and shear tests, reliability tests such as thermal cyde or thermal shock, or upon deprocessing and cross-sectioning.

Further, weakness of the bond pad structure may also reveal itself during wafer probing prior to bonding. Again, the stresses exerted by the probe tips, typically formed of a hard metal such as tungsten, can cause localized fractures in the pads, despite the fact that they make contact with a soft metal, aluminum, on the bond pads. Such fractures are as much of a reliability hazard as those caused during bonding.

Traditionally, the bonding failures have been addressed by altering bonding parameters, such as ultrasonic power and pulse waveform, bonding temperature, bonding time, clamping force, shape of the bonding capillary tip, etc. Much time is spent experimenting with parameter settings and combinations thereof. Although general guidelines of parameter setpoints and configurations have been developed, the bonding failures persist at a sufficiently significant level to continually threaten the reliability of integrated circuit devices. Yet the failure levels are low such that bonding failures become apparent only after several tens of thousands of devices are bonded.

Recent technological advances in semiconductor processing do not alleviate the situation. New dielectric materials with lower dielectric constants are being used to increase circuit speeds but they are mechanically weaker than the conventional plasma enhanced chemical vapor deposition (CVD) dielectrics. Decreasing bond pad dimensions necessitates the increase of vertical bonding force or forces attributable to the use of ultrasonic energy to form effective bonds. Inaccessibility of higher bond parameter settings for fear of damage to the bond pads also results in longer bond formation time, and consequently, lost throughput. All these significant changes point to a trend of more severe failures and increase in their frequency.

SUMMARY OF THE INVENTION

Accordingly, there is a need for a reliable way to prevent or minimize the occurrence of probe and bonding failures where bond pads are situated above one or more structurally and mechanically weak dielectric layers.

In accordance with the present invention, a bond pad reinforcing system and method are provided which eliminate or substantially reduce the disadvantages associated with prior apparatus and methods.

In one aspect of the invention, the reinforcing system for a bond pad according to the teachings of the present invention includes a reinforcing patterned structure disposed in at least one dielectric stack disposed under the bond pad.

In another aspect of the invention, the reinforcing system for a bond pad according to the teachings of the present invention includes at least one dielectric layer or a stack of multiple dielectric layers disposed under the bond pad. A reinforcing patterned structure is disposed in at least one dielectric stack.

In yet another aspect of the invention, a method for reinforcing a bond pad in a semiconductor integrated circuit includes the steps of forming a metal layer, patterning the metal layer in a predetermined area into a predetermined pattern having a plurality of vacant areas, and forming a dielectric layer above the patterned metal layer, filling the vacant areas in the patterned metal layer. A bond pad is then formed on the dielectric layer above the patterned metal layer.

In one aspect of the invention, the reinforcing patterned structure may be a joined or interconnected structure. In another aspect of the invention, the reinforcing patterned structure may comprise disjoined or non-interconnected and repeating elements.

A technical advantage of the present invention is the improved structural integrity of bond pads so that forces exerted during bonding and probing do not damage the bond pad and underlying structures. These technical advantages are possible without changing bonding or probing parameters, which may decrease process throughput. The result is a more reliable integrated circuit and decreasing bonding failures.

BRIEF DESCRIPTION OF THE DRAWINGS

For a better understanding of the present invention, reference may be made to the accompanying drawings, in which.

DETAILED DESCRIPTION OF THE INVENTION

Figure 1:
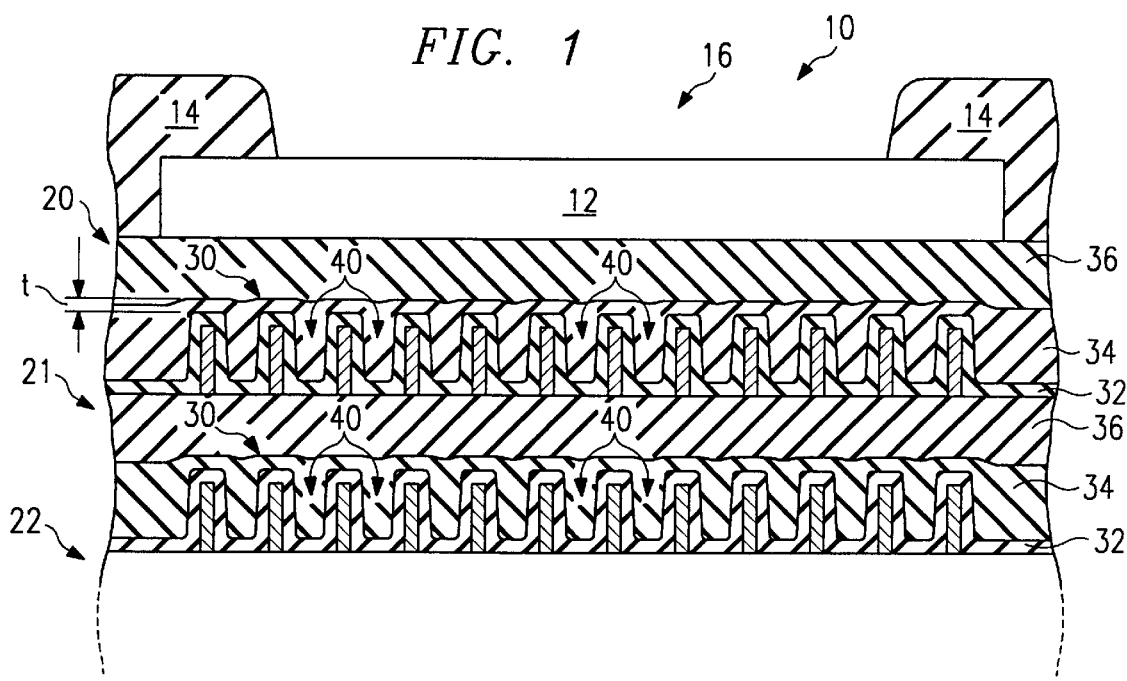
FIG. 1 is a cross-sectional view of an embodiment of a bond pad reinforcing structure according to the teachings of the present invention.

The preferred embodiments of the present invention are illustrated in FIGS. 1–11, like reference numerals being used to refer to like and corresponding parts of the various drawings.

Figure 2:
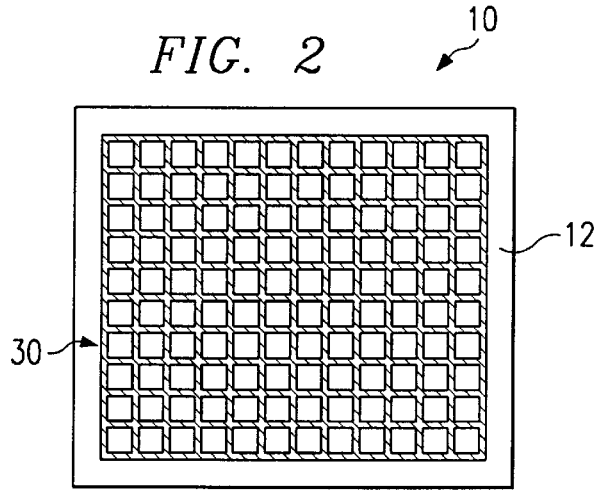
FIG. 2 is a plan view of the bond pad reinforcing structure in FIG. 1 according to the teachings of the present invention.

Referring to FIG. 1, a reinforcing structure 10 for a bond pad 12 according to the teachings of the present invention is shown. A center portion 16 of bond pad 12 is exposed and uncovered from a protective oxide layer 14 for receiving a ball bond (not shown), typically constructed from aluminum, gold, copper, solder, or like materials. Bond pad 12 is typically a multi-layered stack constructed of aluminum and one or more layers of titanium nitride and titanium, for example. Underlying bond pad 14 is one or more intermetal dieletric layers or one or more dielectric stacks 20–22, each constructed of multiple dielectric layers. Each intermetal dielectric layer or stack 20–22 may include a reinforcing grid 30 disposed in at least one of the intermetal dielectric stacks 20–22. FIG. 2 shows a plan view of reinforcing grid 30, which has a regular repeating pattern with a plurality of voids or vacant areas.

At least one layer of the intermetal dielectric materials within each dielectric layer or stack 20–22 is constructed of a mechanically and structurally weak dielectric material, such as oxide, hydrogen silsesquioxane (HSQ), Aerogels, organic polyimides, parylenes, and the like. These dielectric materials are hereinafter referred to generally as weak dielectric materials. Each intermetal dielectric stack 20–22 may include, for example, a first dielectric layer 32, a weak dielectric layer 34, and a second dielectric layer 36. Dielectric layers 32 and 36 may be TEOS (tetraethyl orthosilicate) or any other oxide material formed by a suitable method. It may be seen that by providing a reinforcing structure 30 of a predetermined height, the thickness, t, of weak dielectric layer 34 atop reinforcing structure 30 is greatly reduced. Further, reinforcing structure 30 is a joined or interconnected grid structure with a plurality of voids or vacant areas 40 for containing and accommodating a large portion of weak dielectric material 34 therein. Accordingly, reinforcing structure 30 provides support and mechanical strength to intermetal dielectric stacks 20–22 to substantially decrease the incidents of cratering and other bonding failures causing by wire bonding.

It may be seen from FIGS. 1 and 2 that reinforcing structure 30 is generally planar with a thickness less than the desired thickness of intermetal dielectric stacks 20–22. Further, reinforcing structure 30 is preferably dimensioned to fit generally within and not significantly extending beyond an area defined by bond pad 12. When more than one reinforcing layer is used, reinforcing structure 30 for each intermetal dielectric stack 20–22 may be aligned directly above one another, as shown, or be offset with one another. It is contemplated by the teachings of the present invention that any number, including one, of reinforcing structures or layers may be used to achieve improved structural integrity and robustness. It is also contemplated by the teachings of the present invention that intermetal dielectric layers or stacks 20–22 may include reinforcing structures of different patterns, although such designs may require additional expense to use different masks to pattern etch the different metal reinforcing structures.

Bond pad reinforcing structure 10 may be constructed by forming a layer of metal or any suitable conductor or semiconductor of predetermined thickness at the start of each intermetal dielectric layer or stack 20–22. The reinforcing layer is then pattern etched into the desired pattern, such as the grid pattern shown in FIGS. 1 and 2. Subsequent dielectric materials are then formed above the patterned reinforcing layer, such as a single dielectric layer or oxide layer 32, weak dielectric layer 34, and oxide layer 36 as shown. Note that weak dielectric layer 34 may be formed by a number of methods, including spin-on, plasma enhanced chemical vapor deposition (CVD), and vapor condensation.

Figure 4A:
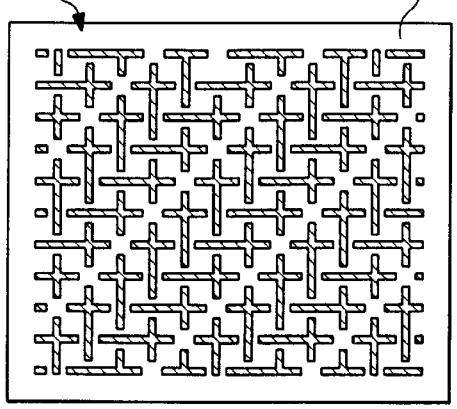
FIGS. 4A and 4B are plan views of the bond pad reinforcing structure in FIG. 3 according to the teachings of the present invention.
Figure 4B:
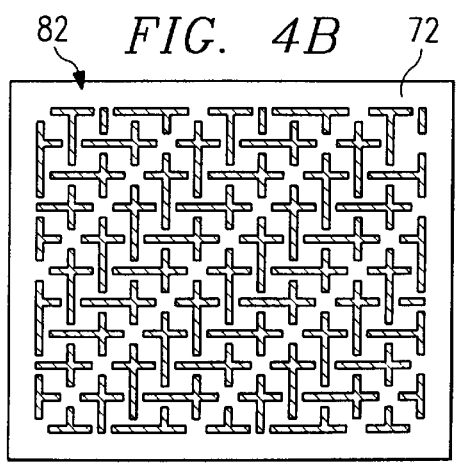
Figure 3:
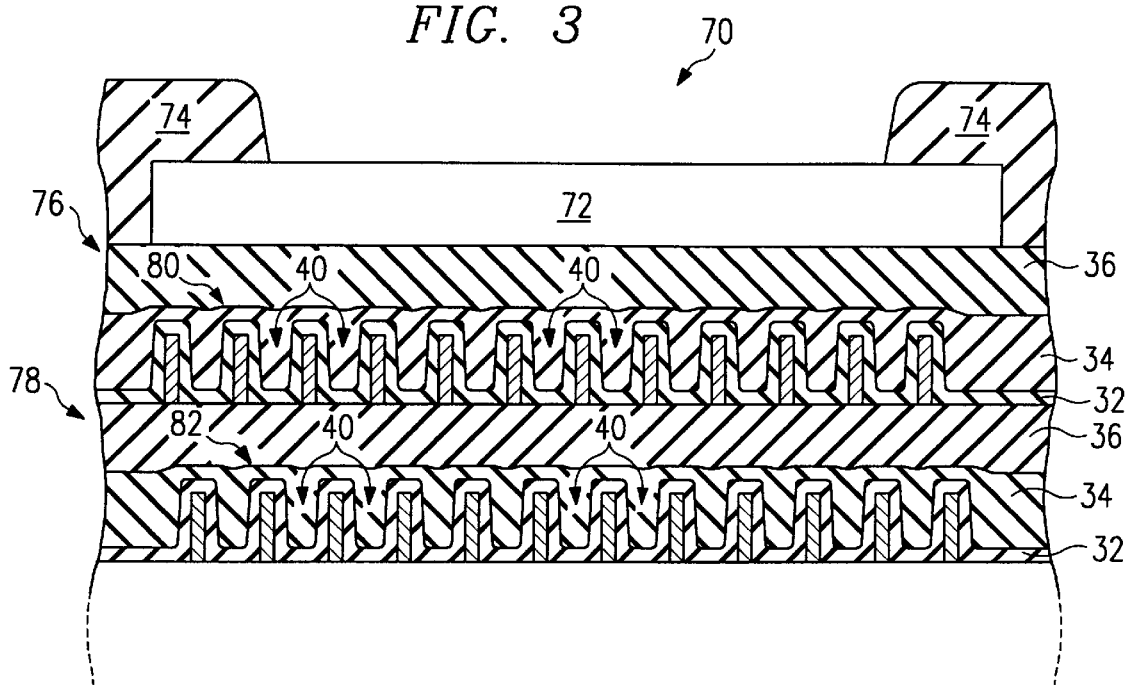
FIG. 3 is a cross-sectional view of another embodiment of a bond pad reinforcing structure according to the teachings of the present invention.

Referring to FIGS. 3, 4A, and 4B, another embodiment of bond pad reinforcing structure 70 is shown. A bond pad 72 is disposed below a protective overcoat of oxide 74 and partially exposed for wire/solder/flip-chip/wedge bonding. Two intermetal dielectric stacks 76 and 78 underlying bond pad 72 include reinforcing structures 80 and 82. Reinforcing structures 80 and 82 include a repeating and non-interconnected pattern such as the crucifix pattern shown arranged in a regular manner. It may be seen that reinforcing structure 80 and 82 may be slightly offset from one another as shown. The semiconductor integrated circuit may include one, two, or more than two intermetal dielectric layers or stacks with the crucifix reinforcing structure although only two are shown herein.

Figure 5:
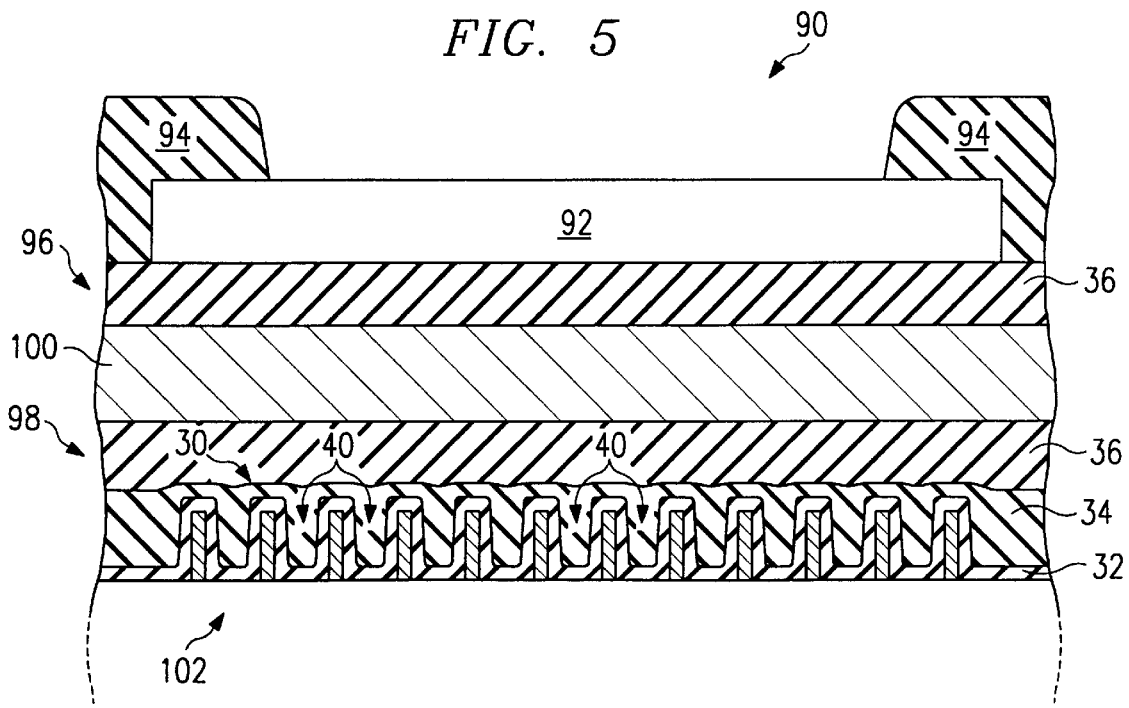
FIG. 5 is a cross-sectional view of yet another embodiment of a bond pad reinforcing structure according to the teachings of the present invention.
Figure 6:
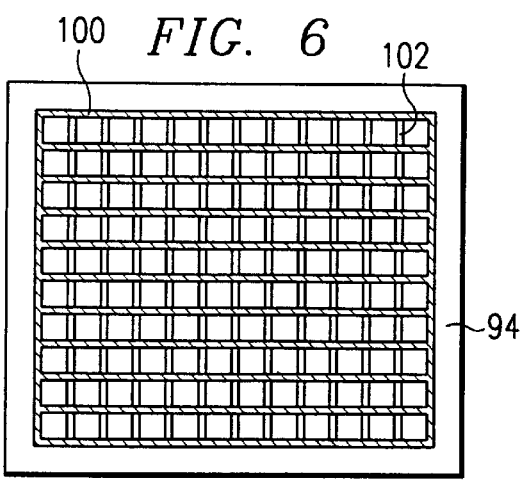
FIG. 6 is a plan view of the bond pad reinforcing structure in FIG. 5 according to the teachings of the present invention.

Yet another embodiment of the reinforcing structure according to the teachings of the present invention is shown in FIGS. 5 and 6 in cross-section and plan views, respectively. Intermetal dielectric stacks 96 and 98 underlie a bond pad 92, which is partially covered by a protective overcoat 94. Intermetal dielectric stacks 96 and 98 include reinforcing structures 100 and 102 respectively. Reinforcing structure 100 in intermetal dielectric stack 96 includes parallel reinforcing lines which are oriented preferably perpendicularly with parallel reinforcing lines of reinforcing structure 102 in intermetal dielectric stack 98. Accordingly, intermetal dielectric stacks in a semiconductor integrated circuit may have reinforcing lines oriented alternately with respect to one another to provide improved mechanical stability and strength. It is further contemplated by the teachings of the present invention to provide for reinforcing lines oriented in a manner other than 90° in alternating layers.

Figure 7:
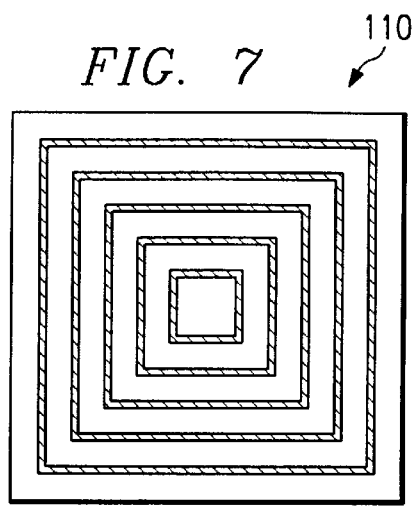
FIGS. 7–11 are further plan views of varying embodiments of the bond pad reinforcing structure according to the teachings of the present invention.

Referring to FIG. 7, an alternate embodiment 110 of the present invention according to the teachings of the present invention is shown. Reinforcing structure pattern 110 includes reinforcing lines forming a plurality of interconnected or unconnected nested rectangles or squares underlying the bond pad.

Figure 8:
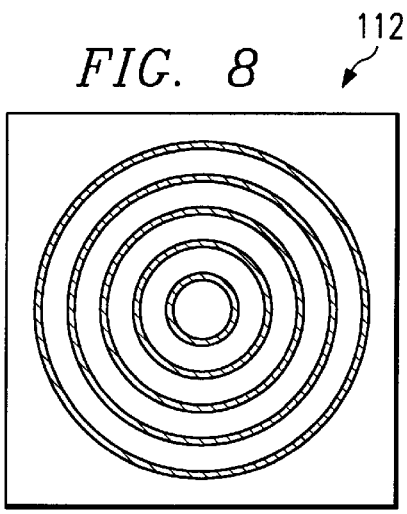
Figure 9:
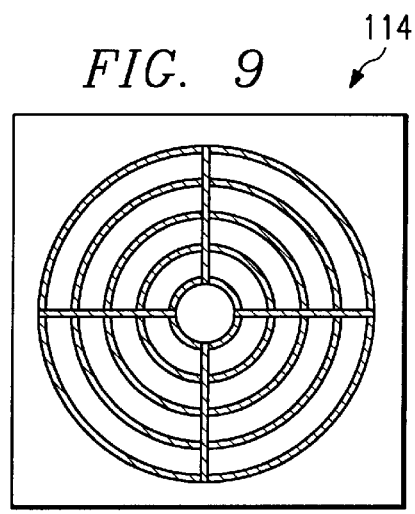
Figure 10:
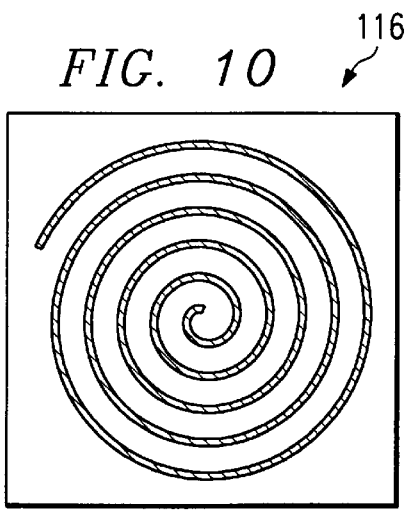

FIG. 8 shows yet another alternate embodiment 112 of possible reinforcing patterns according to the teachings of the present invention. Reinforcing structure 112 may include a plurality of nested unconnected circles or ellipses underlying the bond pad, as shown. A variation on the nested circle structure 112 is an interconnected or crosswise reinforced nested circle or ellipse reinforcing structure 114, as shown in FIG. 9. A further variation is a circular or elliptical spiral reinforcing structure 116 shown in FIG. 10. It may be seen that the teachings of the instant invention further contemplates any nested or spiral, either connected or unconnected, configuration used for the reinforcing structure pattern.

Figure 11:
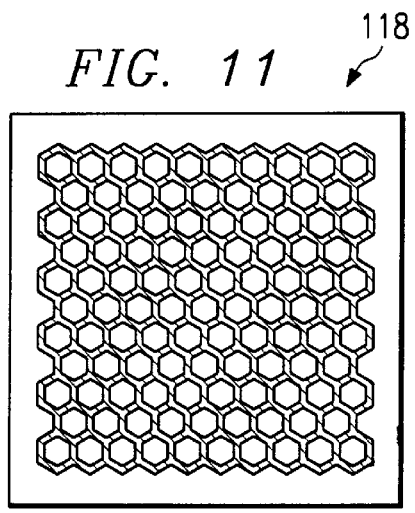

Referring to FIG. 11, a reinforcing structure 118 having a repeating connected honeycomb pattern is shown. Nature has shown that the honeycomb structure has superior structural integrity and strength and would therefore substantially fortify the weak dielectric layers.

It may be seen from above that the reinforcing structure may take on a variety of patterns. In general, the pattern may be regular and repeating, such as the grid, crucifix, honeycomb, and nested configurations. The pattern may also have connected or unconnected reinforcing elements. Non-repeating patterns may also be used. The reinforcing structure pattern preferably occupies the entire or a substantial area under the bond pad and allows the weak dielectric material to fill the vacant areas between the reinforcing lines of the reinforcing structure. Further, the composition of reinforcing structure may be the same as the metalization in the corresponding metal layers. For example, the reinforcing structure may have a titanium nitride/titanium nitride/titanium bottom layer, an aluminum middle layer, and a titanium nitride top layer. Reinforcing structure may also be constructed of other conductive or semiconductive materials.

It may be understood that the reinforcing structure of the instant invention is applicable to strengthen any bond pad with underlying weak dielectric layers so that it may withstand stresses and forces imparted during any wire, solder, or other bonding processes, such as flip-chip bonding, ultrasonic bonding, thermosonic bonding, thermocompression bonding, solder bump or said bump bondings, and pre-bonding wafer probe operation.

Accordingly, the teachings of the present invention includes any structure constructed substantially within the bond pad that mechanically reinforces the underlying brittle and/or soft dielectric structures. It is particularly advantageous when the reinforcing structure is comprised of an existing layer that already goes through patterning, such as the interconnecting metal lines.

Although several embodiments of the present invention and its advantages have been described in detail, it should be understood that mutations, changes, substitutions, transformations, modifications, variations, and alterations can be made therein without departing from the teachings of the present invention, the spirit and scope of the invention being set forth by the appended claims.

What is claimed is:

1. A reinforcing system for a bond pad comprising:
    at least one dielectric layer disposed under the bond pad;
    a reinforcing patterned structure disposed in the at least one dielectric layer; and
    wherein the reinforcing patterned structure includes alternating layers of weak dielectric layers and nonweak dielectric layers having parallel lines oriented generally perpendicularly with one another.

2. A reinforcing system for a bond pad comprising:
    at least two dielectric layers disposed under the bond pad;
    a reinforcing patterned structure disposed in the at least one dielectric layer;
    wherein at least one dielectric layer includes a weak organic dielectric layer; and
    wherein another dielectric layer includes a nonweak dielectric layer between said weak dielectric layer and said bond pad.

3. The reinforcing system, as set forth in claim 2, wherein the reinforcing patterned structure is constructed of reinforcing lines of a material stronger than the dielectric layer.

4. The reinforcing system, as set forth in claim 2, wherein the reinforcing patterned structure is constructed of interconnecting metalization lines.

5. The reinforcing system, as set forth in claim 2, wherein the at least one dielectric layer is at least one multi-layered dielectric stack.

6. The reinforcing system, as set forth in claim 2, wherein the reinforcing patterned structure occupies a substantial area under the bond pad.

7. The reinforcing system, as set forth in claim 2, wherein the reinforcing patterned structure includes vacant areas filled by the dielectric layer.

8. The reinforcing system, as set forth in claim 2, wherein the reinforcing patterned structure includes a grid pattern.

9. The reinforcing system, as set forth in claim 2, wherein the reinforcing patterned structure includes a repeating crucifix pattern.

10. The reinforcing system, as set forth in claim 2, wherein the reinforcing patterned structure includes a honeycomb pattern.

11. The reinforcing system, as set forth in claim 2, wherein the reinforcing patterned structure includes a plurality of connected structural elements.

12. The reinforcing system, as set forth in claim 2, wherein the reinforcing patterned structure includes a plurality of repeating structural elements.

13. The reinforcing system, as set forth in claim 2, wherein the reinforcing patterned structure includes a plurality of repeating non-interconnected structural elements.

14. A bond pad reinforcing system comprising:
    a dielectric stack disposed under a bond pad;
    a metal reinforcing patterned structure disposed in the dielectric stack; and
    wherein the reinforcing patterned structure includes alternating layers of weak dielectric layers and nonweak dielectric layers having parallel lines oriented generally perpendicularly with one another.

15. The reinforcing system, as set forth in claim 14, wherein the dielectric stack comprises multiple dielectric layers with the metal reinforcing patterned structure disposed in at least one dielectric layer therein.

16. The reinforcing system, as set forth in claim 14, wherein the reinforcing patterned structure includes a repeating non-interconnected pattern.

* * * * *